(12) United States Patent
Liu

(10) Patent No.: US 10,153,309 B2
(45) Date of Patent: Dec. 11, 2018

(54) MANUFACTURING METHOD OF DISPLAY PANEL

(71) Applicant: Shenzhen China Star Optoelectronics Technology Co., Ltd., Shenzhen, Guangdong (CN)

(72) Inventor: Yuanfu Liu, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 365 days.

(21) Appl. No.: 14/783,935

(22) PCT Filed: Aug. 14, 2015

(86) PCT No.: PCT/CN2015/086983
§ 371 (c)(1),
(2) Date: Oct. 12, 2015

(87) PCT Pub. No.: WO2017/008366
PCT Pub. Date: Jan. 19, 2017

(65) Prior Publication Data
US 2017/0154904 A1    Jun. 1, 2017

(30) Foreign Application Priority Data
Jul. 15, 2015    (CN) .......................... 2015 1 414055

(51) Int. Cl.
*H01L 21/027*    (2006.01)
*H01L 21/48*    (2006.01)
(Continued)

(52) U.S. Cl.
CPC ........ *H01L 27/1288* (2013.01); *G02F 1/1368* (2013.01); *G02F 1/136286* (2013.01);
(Continued)

(58) Field of Classification Search
None
See application file for complete search history.

(56) References Cited

U.S. PATENT DOCUMENTS

2001/0046016 A1* 11/2001 Park .................... H01L 21/0274
349/139
2009/0176325 A1    7/2009 Jeon et al.
2012/0322213 A1* 12/2012 Lee ....................... G02F 1/1345
438/158

FOREIGN PATENT DOCUMENTS

CN         1901208 A      1/2007
CN         1953190 A      4/2007
(Continued)

*Primary Examiner* — Stephanie P Duclair
(74) *Attorney, Agent, or Firm* — Andrew C. Cheng

(57) ABSTRACT

A manufacturing method of a display panel disclosed by the invention includes: providing a substrate, the substrate having a first metal layer disposed thereon, the substrate including a first display region and a first peripheral region, the first metal layer covering the first display region and the first peripheral region; laying a photoresist layer on the first metal layer to form a first half-finished plate; exposing and developing the first half-finished plate to form a second half-finished plate with first and second preset patterns; etching and stripping the second half-finished plate to form a first preset metal wire group on the first display region and form a second preset metal wire group on the first peripheral region. The invention can significantly reduce the occurrence of electrostatic discharge phenomenon during the manufacturing process of a display panel and thus the yield of the display panel can be greatly improved.

9 Claims, 4 Drawing Sheets

(51) Int. Cl.
  *H01L 21/02* (2006.01)
  *H01L 21/768* (2006.01)
  *H01L 27/146* (2006.01)
  *H01L 27/12* (2006.01)
  *G02F 1/1362* (2006.01)
  *G02F 1/1368* (2006.01)
  *G02F 1/13* (2006.01)
(52) U.S. Cl.
  CPC .... *H01L 21/0273* (2013.01); *H01L 21/02172* (2013.01); *H01L 21/02194* (2013.01); *H01L 21/4825* (2013.01); *H01L 21/76838* (2013.01); *H01L 27/124* (2013.01); *H01L 27/14636* (2013.01); *G02F 1/1303* (2013.01); *G02F 2001/136295* (2013.01)

(56) References Cited

FOREIGN PATENT DOCUMENTS

| CN | 103091915 A | 5/2013 |
|---|---|---|
| CN | 103309101 A | 9/2013 |
| CN | 204230241 U | 3/2015 |
| CN | 104934445 A | 9/2015 |

\* cited by examiner

MANUFACTURING METHOD OF DISPLAY PANEL

CROSS-REFERENCE TO RELATED APPLICATION

This application claims the priority of Chinese Patent Application No. 201510414055.1, entitled "Manufacturing Method Of Display Panel", filed on Jul. 15, 2015, the disclosure of which is incorporated herein by reference in its entirety.

TECHNICAL FIELD

The invention relates to the electronic field, and particularly to a manufacturing method of a display panel.

DESCRIPTION OF RELATED ART

Nowadays, commonly used electronic equipments and apparatuses mainly use metal wires as conductors to propagate signals, the use of the metal wires is helpful for reducing production cost of equipments and improving the stability of electronic equipments, and therefore the material for forming the metal wires is required to have low cost, low resistance and corrosion resistance. The liquid crystal display panel of a liquid crystal display device generally is constituted by a color filter substrate and an array substrate, and gate lines and data lines in the array substrate generally use the material such as aluminum, aluminum alloy or copper as metal wires. However, if a pure aluminum is used for the wires, owing to a stress effect caused by subsequent high temperature process, the surface of the aluminum is easy to form convexes to damage an insulation layer and thereby lead to an abnormal electrical property of thin film transistor. If a pure copper is used for metal electrodes, owing to a poor adhesion between the copper and glass or silicon nitride or silicon oxide, a phenomenon of metal film peeling is easily occurred. In order to solve these problems, a multi-layered aluminum structure or a multi-layered cooper structure is usually used for gate electrodes or data electrodes, and specifically the aluminum or the copper is laminated together with molybdenum or titanium of high corrosion resistance. However, during a manufacturing process of a display panel, different metals in the electrode of multi-layered structure have different etching rates, especially the molybdenum or the titanium is relatively inactive, a large area of underlying molybdenum or titanium residue is often occurred when a large area of metal is to be etched at the periphery of a display region, which is easy to lead to an electrostatic discharge (ESD) phenomenon in subsequent processes, the yield of the panel significantly is reduced as a result.

SUMMARY

Accordingly, a technical problem to be solved by the invention is to provide a manufacturing method of a display panel, so as to improve the yield of the display panel.

In order to achieve above-mentioned objective, embodiments of the invention provide the following technical solutions:

The invention provides a manufacturing method of a display panel including:

providing a substrate, wherein the substrate has a first metal layer disposed thereon, the substrate includes a first display region and a first peripheral region, the first metal layer covers the first display region and the first peripheral region;

laying a photoresist layer on the first metal layer to form a first half-finished plate;

exposing and developing the first half-finished plate to form a second half-finished plate, wherein regions of the second half-finished plate corresponding to the first display region and the first peripheral region are formed with a first preset pattern and a second preset pattern respectively;

etching and stripping the second half-finished plate to form a first preset metal wire group on the first display region and a second preset metal wire group on the first peripheral region.

In one embodiment, a width of each metal wire in the second preset metal wire group is less than 1 centimeter.

In one embodiment, a metal wire in the second preset metal wire group is a straight line, a curved line or a polyline In one embodiment, a metal wire in the second preset metal wire group is a dashed line.

In one embodiment, a distance between each adjacent two metal wires in the second preset metal wire group is the same, that is, the distance between adjacent two metal wires in the second preset metal wire group is the same as the distance between another adjacent two metal wires in the second preset metal wire group.

In one embodiment, the substrate further has a second metal layer disposed thereon, the second metal layer includes a second display region and a second peripheral region; the manufacturing method further includes:

laying a photoresist layer on the second metal layer to form a third half-finished plate;

exposing and developing the third half-finished plate to form a fourth half-finished plate, wherein regions of the fourth half-finished plate corresponding to the second display region and the second peripheral region are formed with a third preset pattern and a fourth preset pattern respectively;

etching and stripping the fourth half-finished plate to form a third preset metal wire group on the second display region and a fourth preset metal wire group on the second peripheral region.

In one embodiment, a width of each metal wire in the fourth preset metal wire group is less than 1 centimeter.

In one embodiment, a metal wire in the fourth preset metal wire group is a straight line, a curved line or a polyline.

In one embodiment, a metal wire in the fourth preset metal wire group is a dashed line.

In one embodiment, a distance between each adjacent two metal wires in the fourth preset metal wire group is the same, that is, the distance between adjacent two metal wires in the fourth preset metal wire group is the same as the distance between another adjacent two metal wires in the fourth preset metal wire group.

Sum up, the manufacturing method of a display panel of the invention includes: providing a substrate, the substrate having a first metal layer disposed thereon, the substrate including a first display region and a first peripheral region, the first metal layer covering the first display region and the first peripheral region; laying a photoresist layer on the first metal layer to form a first half-finished plate; exposing and developing the first half-finished plate to form a second half-finished plate, wherein regions of the second half-finished plate corresponding to the first display region and the first peripheral region are formed with a first preset pattern and a second preset pattern respectively; etching and stripping the second half-finished plate to form a first preset metal wire group on the first display region and a second preset metal wire group on the first peripheral region. Owing to forming the second preset metal wire group on the first peripheral region, multiple drainage channels are formed to guide the etching solution to flow during the etching, the speed and the range/scope of the etching are increased, so that a large area of metal residue is not appeared in the first peripheral region, and the occurrence of electrostatic discharge phenomenon during the manufacturing process of the display panel can be significantly reduced and the yield of the display panel can be greatly improved.

BRIEF DESCRIPTION OF THE DRAWINGS

In order to more clearly illustrate the technical solutions of the invention, drawings will be used in the description of embodiments will be given a brief description below. Apparently, the drawings in the following description of embodiments only are some of embodiments of the invention, the ordinary skill in the art can obtain other drawings according to these illustrated drawings without creative effort.

DETAILED DESCRIPTION OF EMBODIMENTS

In the following, with reference to accompanying drawings of embodiments of the invention, technical solutions in embodiments of the invention will be clearly and completely described.

Figure 1:
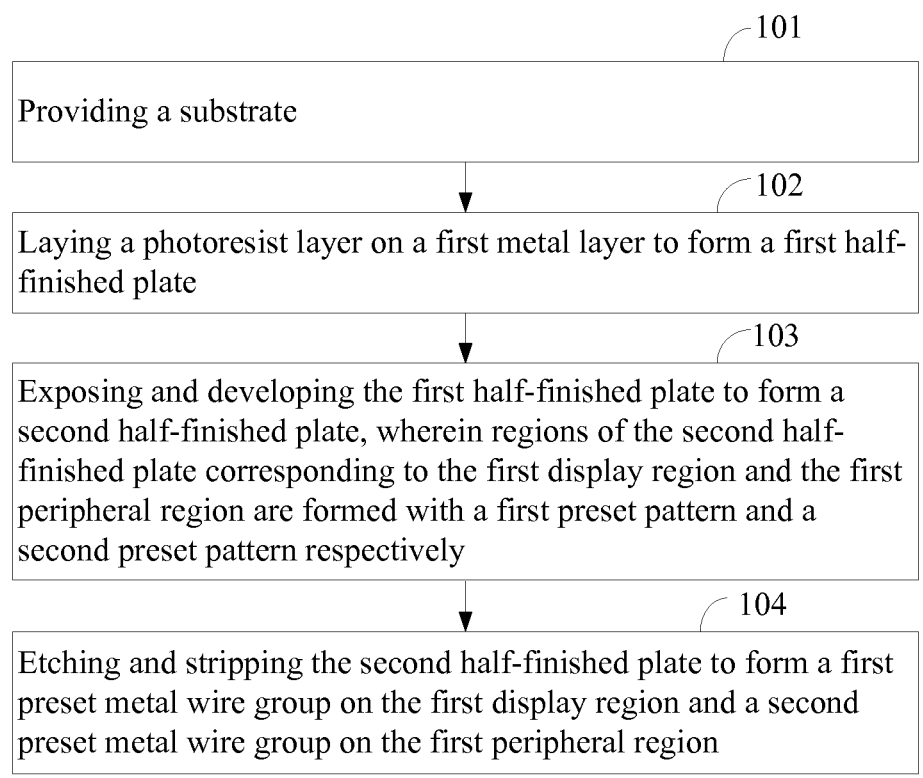
FIG. 1 is a flowchart of a manufacturing method of a display panel provided by a first embodiment of the invention.
Figure 2:
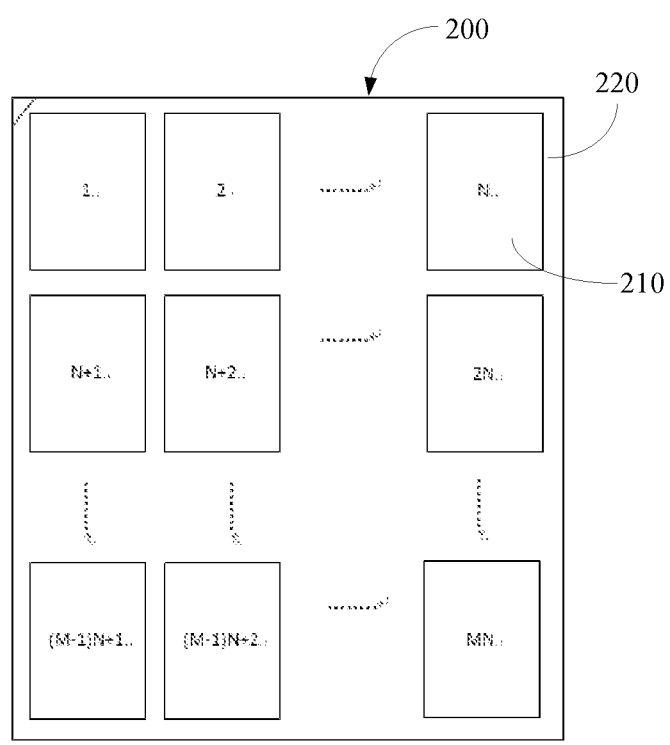
FIG. 2 is a schematic view of a display panel manufactured by the method shown in FIG. 1 being in the step 101.
Figure 3:
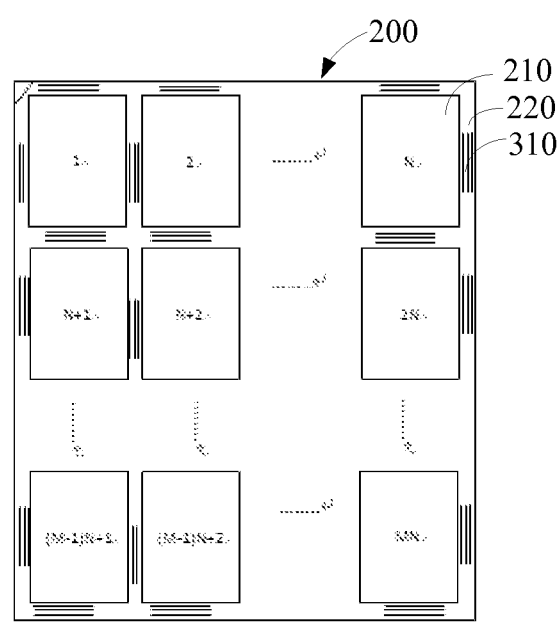
FIG. 3 is a schematic view of a display panel manufactured by the method shown in FIG. 1 being in the step 104, where a first preset metal wire group of the display region is not shown.

Please referring to FIG. 1 through FIG. 3, a first embodiment of the invention provides a manufacturing method of a display panel. The method includes the following steps:

Step 101, providing a substrate 200. The substrate 200 has a first metal layer disposed thereon. The substrate 200 includes a first display region 210 and a first peripheral region 220. The first metal layer covers the first display region 210 and the first peripheral region 220.

It should be noted that, the substrate 200 may be a thin film transistor (TFT) array substrate. The first metal layer may be the first layer on the substrate or also may be the other layer of the substrate. The first metal layer may be formed on the substrate by sputtering a metal into a film. The first metal layer is a metal film. The first peripheral region 220 is a peripheral region of the first display region 210. The first metal layer may be a layer formed by that aluminum or copper is laminated together with an inactive metal (such as molybdenum or titanium).

Step 102, laying a photoresist layer on the first metal layer to form a first half-finished plate.

It should be noted that, in the present embodiment, the photoresist is coated on a surface of the first half-finished plate by a spin coating method or a roll coating method. In other embodiment, the photoresist may be coated on the surface of the first half-finished plate by other method.

Step 103, exposing and developing the first half-finished plate to form a second half-finished plate, wherein regions of the second half-finished plate corresponding to the first display region and the first peripheral region are formed with a first preset pattern and a second preset pattern respectively.

In the present embodiment, the photoresist is a positive-type photoresist. When the positive-type photoresist is illuminated/irradiated under a predetermined wavelength ultraviolet, the illuminated part of the positive-type photoresist is decomposed and the solubility is increased, so that the first preset pattern is formed in the region of the first half-finished plate corresponding to the first display region and the second preset pattern is formed in the region of the first half-finished plate corresponding to the first peripheral region. In other embodiment, the photoresist may be a negative-type photoresist instead. When the negative-type photoresist is illuminated/irradiated under a predetermined wavelength ultraviolet, the illuminated part of the negative-type photoresist is reacted and the solubility is decreased, so that an opposite/complementary pattern relative to the first preset pattern is formed in the region of the first half-finished plate corresponding to the first display region and an opposite pattern relative to the second preset pattern is formed in the region of the first half-finished plate corresponding to the first peripheral region.

Step 104, etching and stripping the second half-finished plate to form a first preset metal wire group (not shown) on the first display region and a second preset metal wire group 310 on the first peripheral region (referring to FIG. 3).

It should be noted that, a mixed acid may be used as an etchant. The mixed acid includes a phosphoric acid and a nitric acid. An alkali lye with preset concentration may be used for stripping, so that the first preset metal wire group is formed on the first display region and the second preset metal wire group is formed on the first peripheral region. The alkali lye with preset concentration may be KOH, NaOH or an organic base. A drainage channel is formed between adjacent two metal wires to guide a flowing direction of the etching solution. The first preset metal wire group includes gate lines and date lines, and it is well known that the gate lines generally are arranged crossing with the data lines.

It should be noted that, after the completion of the step 104, the display panel has not yet been finished, subsequent steps such as vacuum process are needed, and finally a cutting process is performed to obtain individual display panels.

In the present embodiment, the manufacturing method of the display panel includes: providing a substrate, the substrate having a first metal layer disposed thereon, the substrate including a first display region and a first peripheral region, the first metal layer covering the first display region and the first peripheral region; laying a photoresist layer on the first metal layer to form a first half-finished plate; exposing and developing the first half-finished plate to form a second half-finished plate, wherein regions of the second half-finished plate corresponding to the first display region and the first peripheral region are formed with a first preset pattern and a second preset pattern respectively; etching and stripping the second half-finished plate to form a first preset metal wire group (not shown) on the first display region and a second preset metal wire group 310 on the first peripheral region. Owing to forming the second preset metal wire group 310 on the first peripheral region, multiple drainage channels are formed to guide the etching solution to flow during the etching, the speed and the range/scope of the etching are increased, so that a large area of metal residue is not appeared in the first peripheral region, and the occurrence of electrostatic discharge phenomenon during the manufacturing process of the display panel can be significantly reduced, and the yield of the display panel can be greatly improved.

Optionally, in the present embodiment, a width of each metal wire in the second preset metal wire group 310 may be less than 1 centimeter (cm), preferably is 2 µm. A metal wire in the second preset metal wire group 310 may be a straight line, a curved line or a polyline. In other embodiment, the metal wire of the second preset metal wire group 310 may be other shaped line.

Optionally, in the present embodiment, a metal wire in the second preset metal wire group is a dashed line.

It should be noted that, compared with the metal wire of solid line, the metal wire of dashed line with the same length has a smaller amount of metal and may form more number of the drainage channels, the speed and the range/scope of etching can be further increased, the amount of residual metal in the first peripheral region can be largely decreased, so that the occurrence of electrostatic discharge phenomenon during the manufacturing process of the display panel can be significantly reduced and therefore the yield of the display panel can be further improved. In other embodiment, the metal wire of the second preset metal wire group may be a solid line instead.

Optionally, a distance between each adjacent two metal wires in the second preset metal wire group 310 is the same.

It should be noted that, owing to the distance between each adjacent two metal wires being the same, the several drainage channels are the same and uniform, the etching solution is guided uniformly to flow, so that the speed and range/scope of the etching become more uniform, a large area of metal residue is not appeared in the first peripheral region and the occurrence of electrostatic discharge phenomenon during the manufacturing process of the display panel can be greatly reduced, and the yield of the display panel can be greatly increased. In other embodiment, the distance between each adjacent two metal wires in the second preset metal wire group 310 also may be not the same.

Figure 4:
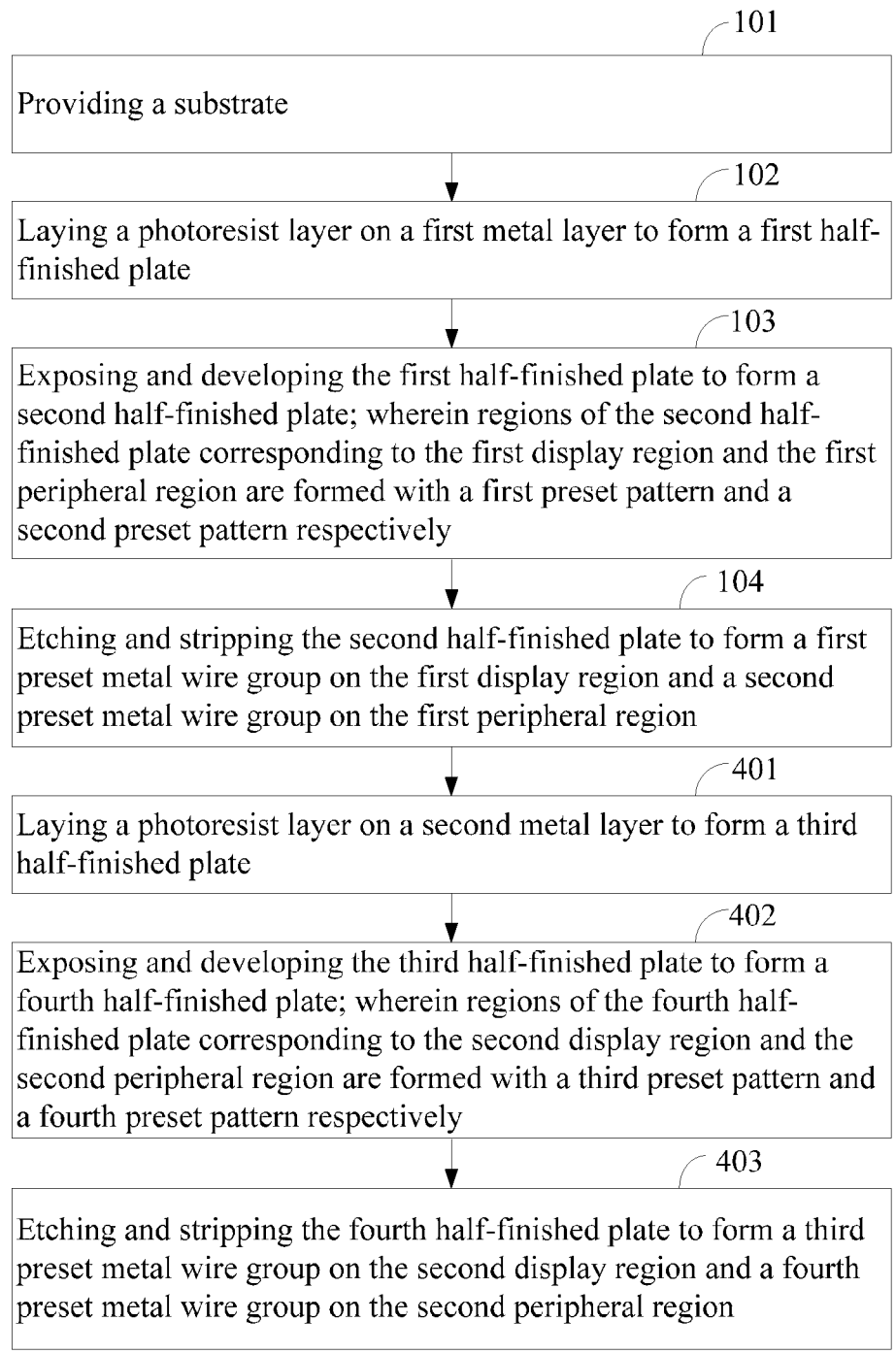
FIG. 4 is a flowchart of a manufacturing method of a display panel provided by a second embodiment of the invention.

Please referring to FIG. 4, a second embodiment of the invention provides a manufacturing method of a display panel. The manufacturing method provided by the second embodiment is similar to the manufacturing method provided by the first embodiment, and a difference between the two embodiments is that: in the second embodiment, the substrate further has a second metal layer disposed thereon. The second metal layer includes a second display region and a second peripheral region. The second display region corresponds to the first display region. The second peripheral region corresponds to the first peripheral region. The second metal layer may be a layer formed by that aluminum or copper is laminated together with an inactive metal (such as molybdenum or titanium). The manufacturing method associated with the second embodiment further includes the following steps.

Step 401, laying a photoresist layer on the second metal layer to form a third half-finished plate.

It should be noted that, in the present embodiment, a photoresist is coated on a surface of the second half-finished plate by a spin coating method or a roll coating method. In other embodiment, the photoresist may be coated on the surface of the second half-finished plate by other method.

Step 402, exposing and developing the third half-finished plate to form a fourth half-finished plate, wherein regions of the fourth half-finished plate corresponding to the second display region and the second peripheral region are formed with a third preset pattern and a fourth preset pattern respectively.

In the present embodiment, the photoresist is a positive-type photoresist. When the positive-type photoresist is illuminated/irradiated under a predetermined wavelength ultraviolet, the illuminated part of the positive-type photoresist is decomposed and the solubility is increased, so that the third preset pattern is formed in the region of the third half-finished plate corresponding to the second display region and the fourth preset pattern is formed in the region of the third half-finished plate corresponding to the first peripheral region. In other embodiment, the photoresist may be a negative-type photoresist instead. When the negative-type photoresist is illuminated/irradiated under a predetermined wavelength ultraviolet, the illuminated part of the negative-type photoresist is reacted and the solubility is decreased, so that an opposite/complementary pattern with respect to the third preset pattern is formed in the region of the third half-finished plate corresponding to the first display region and an opposite pattern with respect to the fourth preset pattern is formed in the region of the third half-finished plate corresponding to the first peripheral region.

Step 403, etching and stripping the fourth half-finished plate to form a third preset metal wire group on the second display region and a fourth preset metal wire group on the second peripheral region.

It should be noted that, a mixed acid may be used as an etchant. The mixed acid includes a phosphoric acid and a nitric acid. An alkali lye with preset concentration may be used for stripping, and thereby the third preset metal wire group is formed in the second display region and the fourth preset metal wire group is formed in the first peripheral region. The alkali lye with preset concentration may be KOH, NaOH or an organic base. A drainage channel is formed between adjacent two metal wires to guide a flowing direction of the etching solution. The third preset metal wire group includes gate lines and date lines, and it is well known that the gate lines generally are arranged crossing with the data lines.

In the present embodiment, the manufacturing method of the display panel associated with the second embodiment includes: laying a photoresist layer on the second metal layer to form the third half-finished plate; exposing and developing the third half-finished plate to form a fourth half-finished plate, wherein regions of the fourth half-finished plate corresponding to the second display region and the second peripheral region are formed with the third preset pattern and the fourth preset pattern respectively; etching and stripping the fourth half-finished plate to form a third preset metal wire group on the second display region and a fourth preset metal wire group on the second peripheral region. Owing to forming the fourth preset metal wire group on the second peripheral region, serval drainage channels are formed to guide the etching solution to flow during the etching, the speed and the range/scope of the etching are increased, so that a large area of metal residue is not appeared in the first peripheral region, and the occurrence of the electrostatic discharge phenomenon during the manufacturing process of the display panel can be significantly reduced and the yield of the display panel can be greatly increased as a result.

Optionally, a width of each metal wire in the fourth metal wire group may be less than 1 centimeter (cm), preferably is 2 µm. A metal wire in the fourth preset metal wire group may be a straight line, a curved line or a polyline. In other embodiment, the metal wire of the fourth preset metal wire group may be other shaped line.

Optionally, in the present embodiment, a metal wire in the fourth preset metal wire group is a dashed line.

It should be noted that, compared with the metal wire of solid line, the metal wire of dashed line with the same length has a smaller amount of metal and can form more number of the drainage channels, so that the speed and the range/scope of the etching are increased, the amount of residual metal in the second peripheral region may be largely decreased, the occurrence of electrostatic discharge phenomenon during the manufacturing process of the display panel can be significantly reduced and the yield of the display panel can be greatly improved. In other embodiment, the metal wire of the fourth preset metal wire group may be a solid line instead.

Optionally, a distance between each adjacent two metal wires in the fourth preset metal wire group is the same.

It should be noted that, owing to the distance between each adjacent two metal wires being equal, the several drainage channels are the same and uniform, the etching solution can be guided uniformly to flow, the speed and range/scope of the etching become more uniform, so that a large area of metal residue is not appeared in the second peripheral region, and the occurrence of electrostatic discharge phenomenon during the manufacturing process of the display panel can be significantly reduced and the yield of the display panel can be greatly increased. In other embodiment, the distance between each adjacent two metal wires in the fourth preset metal wire group may be not equal.

The foregoing discussion only is some preferred embodiments of the invention, it should be noted that, for ordinary skill in the art, under the premise of without departing from the principle of the invention, several modification and variations can be made, and these modifications and variations should be included in the protection scope of the invention.

What is claimed is:

1. A manufacturing method of a display panel, comprising:
    providing a substrate, the substrate having a first metal layer disposed thereon, the substrate comprising a first display region and a first peripheral region, the first metal layer covering the first display region and the first peripheral region;
    laying a photoresist layer on the first metal layer to form a first half-finished plate;
    exposing and developing the first half-finished plate to form a second half-finished plate, wherein regions of the second half-finished plate corresponding to the first display region and the first peripheral region are formed with a first preset pattern and a second preset pattern respectively;
    etching and stripping the second half-finished plate to form a first preset metal wire group on the first display region and form a second preset metal wire group on the first peripheral region,
    wherein the second preset metal wire group comprises a plurality of metal wires, and at least one of the metal wires in the second preset metal wire group is a dashed line comprising a plurality of dashed segments disconnected from each other.

2. The manufacturing method of a display panel as claimed in claim 1, wherein a width of each metal wire in the second preset metal wire group is less than 1 centimeter.

3. The manufacturing method of a display panel as claimed in claim 1, wherein each metal wire in the second preset metal wire group is a dashed line.

4. The manufacturing method of a display panel as claimed in claim 1, wherein a distance between each adjacent two metal wires in the second preset metal wire group is the same.

5. The manufacturing method of a display panel as claimed in claim 1, wherein the substrate further has a second metal layer disposed thereon, the second metal layer comprises a second display region and a second peripheral region; the manufacturing method further comprises:
    laying a photoresist layer on the second metal layer to form a third half-finished plate;
    exposing and developing the third half-finished plate to form a fourth half-finished plate, wherein regions of the fourth half-finished plate corresponding to the second display region and the second peripheral region are formed with a third preset pattern and a fourth preset pattern respectively;
    etching and stripping the fourth half-finished plate to form a third preset metal wire group on the second display region and a fourth preset metal wire group on the second peripheral region.

6. The manufacturing method of a display panel as claimed in claim 5, wherein a width of each metal wire in the fourth preset metal wire group is less than 1 centimeter.

7. The manufacturing method of a display panel as claimed in claim 5, wherein a metal wire in the fourth preset metal wire group is a straight line, a curved line or a polyline.

8. The manufacturing method of a display panel as claimed in claim 5, wherein a metal wire in the fourth preset metal wire group is a dashed line.

9. The manufacturing method of a display panel as claimed in claim 5, wherein a distance between each adjacent two metal wires in the fourth preset metal wire group is the same.

* * * * *

UNITED STATES PATENT AND TRADEMARK OFFICE
CERTIFICATE OF CORRECTION

PATENT NO.        : 10,153,309 B2
APPLICATION NO.   : 14/783935
DATED             : December 11, 2018
INVENTOR(S)       : Yuanfu Liu Page 1 of 1

It is certified that error appears in the above-identified patent and that said Letters Patent is hereby corrected as shown below:

On the Title Page

Item (30) should be corrected to read:
Jul. 15, 2015 (CN) ..................... 2015 10414055

Signed and Sealed this
Sixteenth Day of April, 2019

Andrei Iancu
*Director of the United States Patent and Trademark Office*